United States Patent [19]
Kim

[11] Patent Number: 6,008,526
[45] Date of Patent: Dec. 28, 1999

[54] DEVICE ISOLATION LAYER FOR A SEMICONDUCTOR DEVICE

[75] Inventor: Hyung-seob Kim, Suwon, Rep. of Korea

[73] Assignee: Samsung Electronics Co., Ltd., Rep. of Korea

[21] Appl. No.: 09/022,149

[22] Filed: Feb. 11, 1998

Related U.S. Application Data

[62] Division of application No. 08/567,511, Dec. 5, 1995, Pat. No. 5,807,784.

[30] Foreign Application Priority Data

May 30, 1995 [KR] Rep. of Korea .................... 9513963

[51] Int. Cl.⁶ .................................................. H01L 23/58
[52] U.S. Cl. ............................................ 257/647; 257/509
[58] Field of Search .................................... 257/509, 647

[56] References Cited

U.S. PATENT DOCUMENTS

| | | | |
|---|---|---|---|
| 4,056,415 | 11/1977 | Cook, Jr. et al. | 257/647 |
| 4,740,480 | 4/1988 | Ooka | 257/647 |
| 4,825,277 | 4/1989 | Mattox et al. | 257/647 |
| 4,952,525 | 8/1990 | Van Der Plas | 438/443 |
| 5,099,304 | 3/1992 | Takemura et al. | 257/647 |
| 5,168,343 | 12/1992 | Sakamoto | 257/647 |
| 5,393,693 | 2/1995 | Ko et al. | |
| 5,445,989 | 8/1995 | Lur et al. | 437/72 |
| 5,498,566 | 3/1996 | Lee | 437/72 |

FOREIGN PATENT DOCUMENTS

| | | |
|---|---|---|
| 0252450 | 1/1988 | European Pat. Off. |
| 59-188938 | 10/1984 | Japan |
| 61-216456 | 9/1986 | Japan |
| 63-110658 | 5/1988 | Japan |
| 3-24727 | 2/1991 | Japan |

OTHER PUBLICATIONS

IBM Technical Disclosure Bulletin, vol. 27, No. 11, Apr. 1985, pp. 6703.

*Primary Examiner*—David B. Hardy
*Attorney, Agent, or Firm*—Myers Bigel Sibley & Sajovec

[57] ABSTRACT

A field oxide layer for a semiconductor device includes an upper portion of first thickness extending above the major surface of a semiconductor substrate, and a lower portion of second thickness extending below the major surface of the semiconductor substrate. The ratio of first thickness to second thickness is not less than 1 to 2.

5 Claims, 6 Drawing Sheets

DEVICE ISOLATION LAYER FOR A SEMICONDUCTOR DEVICE

This application is a divisional of Ser. No. 08/567,511, filed Dec. 5, 1995 which is now U.S. Pat. No. 5,807,784.

BACKGROUND OF THE INVENTION

The present invention relates to a semiconductor device and manufacturing method for same. More particularly, the present invention relates to a device isolation layer formed in a semiconductor device, and a method for forming same this layer using oxygen ion implantation.

As semiconductor devices become ever more highly integrated, active devices formed on the semiconductor substrate have decreased to a size near or below 1 micron. This dramatic reduction in size has also taken place with respect to device isolation regions which electrically separate the active devices. The size and nature of a typical device isolation region, which is formed early in the manufacturing process of the overall semiconductor device, influence the size of the active regions subsequently formed on the semiconductor substrate, and margins between such devices. This fact requires semiconductor manufacturers to add a planarizing step to remove step differences, i.e., surface undulations, in many field insulating layers. The conventional method of local oxidation of silicon (LOCOS) presently used by semiconductor manufacturers has several disadvantages including the "bird's beak phenomenon" caused by lateral oxidation, the formation of crystal defects in the substrate caused by heat stress, and undesired redistribution of implanted impurities used as a channel stopper. Accordingly, LOCOS fails to attain the improved electrical characteristics necessary for higher integration of semiconductor devices.

To overcome the disadvantages attendant to LOCOS, a trench isolation method has been proposed. In this method, a field oxide layer is not formed by thermal oxidation as in LOCOS. Thus, the disadvantages associated with the thermal oxidation step in LOCOS are somewhat reduced.

However, the trench isolation method is not without its own problems. For example, formation of the trench to a depth greater than the designed depth creates crystal defects in the silicon substrate. Additionally, when insulation material is filled into a broad trench, the insulation material often has an uneven profile. Such an uneven profile leads to unstable device isolation characteristics and structural step differences in the trench pattern.

The foregoing isolation methods, LOCOS and trench, will be explained in greater detail with reference to FIGS. 1A and 1B, and FIGS. 2A, 2B, 2C, and 2D.

FIGS. 1A and 1B are cross-sectional views illustrating the conventional LOCOS isolation method. Referring to FIG. 1A, a pad oxide layer 3 and a silicon nitride layer 5 are sequentially formed on a semiconductor substrate 1. A portion of silicon nitride layer 5 in a field region 9 is then removed by photolithography. Thereafter, a channel stopper ion 7 is implanted into field region 9. Thus, an active region 11 is isolated by field regions 9.

Referring now to FIG. 1B, the semiconductor substrate having field regions 9 and active region 11 is placed in an oxidation furnace and subjected to thermal oxidation under predetermined conditions to form a field oxide layers 13 from field regions 9. A channel stopper region 15 of impurities redistributed by thermal diffusion is formed under each field oxide layer 13. Also, during thermal oxidation, the semiconductor substrate adjacent to field region 9 is oxidized in a direction towards the active region 11 which leads to the bird's beak phenomenon. Thus, the "actual" field region 20 extends laterally into regions 19 to form the bird's beak, rather than remaining within the originally intended field region 17. The bird's beak phenomenon may be seen as an undesired and uncontrolled expansion of the field region beyond its intended design rule margins. This phenomenon adversely impacts attempts to maintain the fine patterns required in highly integrated semiconductor devices.

Additionally, in LOCOS, the field oxide layer is thermally grown to not less than 3,000 Å in thickness. Accordingly, the potential for crystal defect caused by the stress occurring around the boundary of the active region and the silicon nitride layer which is selectively covered on the semiconductor substrate can lead to increased leakage current between devices.

FIGS. 2A–2D are cross-sectional views sequentially illustrating the conventional trench isolation method.

Referring to FIG. 2A, a pad oxide layer 2 of about 240 Å in thickness is formed over semiconductor substrate 1 by the thermal oxidation. A silicon nitride layer 4 of about 1,500 Å thickness and a thermal oxide layer 6 of about 1,000 Å thickness are sequentially formed by low pressure chemical vapor deposition (LPCVD), and the thermal oxide layer over a field region is then removed by photolithography.

Referring to FIG. 2B, by using the thermal oxide layer remaining over the active region as an etching mask, silicon nitride 4 and pad oxide layer 2 is subjected to reactive ion etching and semiconductor substrate 1 is then dry etched to form a trench. At this time, a narrow trench region and a broad trench region coexist in the substrate in accordance with the design rule of the semiconductor device.

Thereafter, a side wall oxide layer 8 is formed inside the trench by the thermal oxidation, and polysilicon 10 is then deposited to a thickness not less than 5,000 Å, and is anisotropically etched to fill the trench with polysilicon. At this time, the narrow trench region is completely filled, but the polysilicon in the broad trench region is sunken in its center region. That is, varying loading effects occur wherein each trench depending upon the trench's size, and these loading effects determine the "filler" profile of the polysilicon.

Referring to FIG. 2C, a field oxide layer 12 is formed on the polysilicon filling the trench using a thermal oxidation process. Note that "filled" profile of the broad trench region remains sunken in its center region.

Referring to FIG. 2D, the buffer layers including the thermal oxide layer, the silicon nitride layer and the pad oxide layer, are wet etched using a buffered oxide etchant (B.O.E). The B.O.E. may comprise a mixed solution of fluoroammonium and fluorohydrogen (7:1), and phosphoric acid solution. A sacrificial oxide layer (not shown) is thereafter grown and then wet etched, whereby the formation of the device isolation process is completed.

In the trench isolation method, a gate line and bit line may be shorted, or an electrical interconnection characteristic be deteriorated by sunken center region phenomenon (indicated by the letter G in FIG. 2D) of polysilicon filling the broad trench region. At a minimum, this phenomenon reduces product yield.

The bird's beak phenomenon (indicated by the letter R in FIG. 2D) occurs during the formation of the field oxide layer and limits the reduction of the device isolation region size. Also, when the thermal oxide layer of the buffer layer is etched, the field oxide layer is simultaneously etched to a predetermined thickness. Therefore, the field oxide layer should be increased in thickness in consideration of the process margin. Accordingly, the bird's beak phenomenon is deepened, thereby precluding the desired higher integration of the semiconductor device.

In response to the foregoing problems arising in the trench isolation method, an improved trench isolation method incorporating a chemical-mechanical polishing (CMP) step has previously been proposed. This improved trench method has been considered an ideal method for completely filling the trench, and thereafter etching the insulating material overfilling the trench, because the insulation material refilled in the trench is removed in the horizontal direction. However, the added CMP step also has disadvantages such as the "dishing" phenomenon, wherein the center of the broad trench region becomes hollowed out into a dish shape when the width of the wide trench is greater than several mm. Such adverse affects create unstable device isolation characteristics and the structural step differences.

SUMMARY OF THE INVENTION

The present invention provides a LOCOS device isolation layer in a semiconductor device which allows high integration of active devices to be realized.

To achieve this result the present invention provides, in one aspect, a device isolation layer formed by LOCOS, comprising; a semiconductor substrate having a major surface, and a field oxide layer having an upper portion of first thickness formed above the major surface of the semiconductor substrate, and a lower portion of second thickness formed in the semiconductor substrate, wherein the ratio of first thickness to second thickness is not less than 1 to 2.

In another aspect, the present invention provides a device isolation layer in a semiconductor device comprising; a trench formed in a field region of a semiconductor substrate, a field oxide layer formed in a bottom portion of the trench; and an insulating layer formed over the field oxide layer to fill the trench. Additionally, the upper surface of the insulating layer may be planarized.

In yet another aspect the present invention provides a method of forming a device isolation layer in a semiconductor device comprising the steps of; implanting oxygen ions in a field region of a major surface of semiconductor substrate, and oxidizing the oxygen implanted region to form a field oxide layer having an upper portion of first thickness formed above the major surface of the semiconductor substrate, and a lower portion of second thickness formed in the semiconductor substrate, wherein the ratio of first thickness to second thickness is not less than 1 to 2.

In still another aspect, the present invention provides a method of forming a device isolation layer in a semiconductor device, comprising the steps of; forming a trench in a field region of a semiconductor substrate, implanting oxygen ions into a bottom surface of the trench, oxidizing the oxygen implanted region to form a field oxide layer which partially fills the trench, and depositing insulation material to fill the trench.

Finally, the present invention provides a method of forming a device isolation layer in a semiconductor device, comprising the steps of; forming an etch blocking layer on the surface of a semiconductor substrate, patterning the etch blocking layer to expose a portion of the semiconductor substrate, forming a trench in the exposed portion of the semiconductor substrate, implanting oxygen ions into a bottom surface of the trench, oxidizing the oxygen implanted region to form a field oxide layer having an upper portion of first thickness formed above a bottom surface of the trench to partially fill the trench, and a lower portion of second thickness formed in the semiconductor substrate below the bottom surface of the trench, wherein the ratio of first thickness to second thickness is not less than 1 to 2, depositing insulation material over field oxide layer to fill the trench, and planarizing an upper surface of the insulation material by a chemical-mechanical polishing method using the etch blocking layer and as an etch stopper.

In each of the foregoing aspects, the present invention provides a field oxide layer formed from implanted oxygen ions in a semiconductor substrate, the field oxide layer being deeply formed into the semiconductor substrate to thereby improve a device isolation characteristics, and suppress the bird's beak and or dishing phenomenon.

BRIEF DESCRIPTION OF THE DRAWINGS

The foregoing advantages of the present invention will become more apparent upon consideration of the preferred embodiments set forth below with reference to the attached drawings in which.

DETAILED DESCRIPTION OF THE INVENTION

Figure 1A:
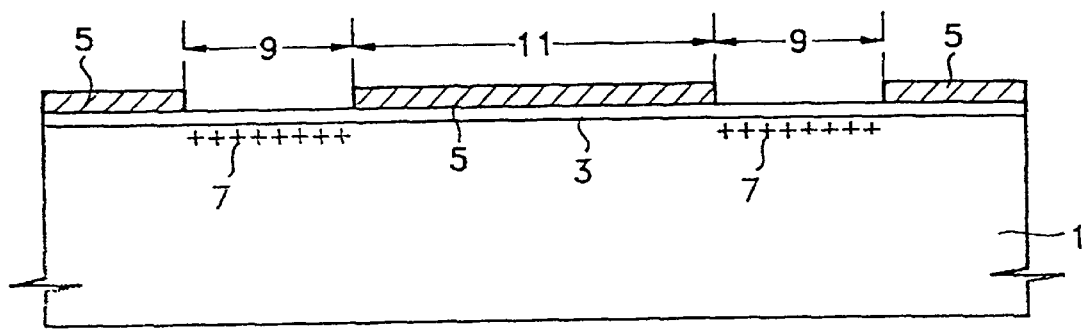
FIGS. 1A and 1B are cross-sectional views for illustrating a conventional LOCOS isolation method.
Figure 1B:
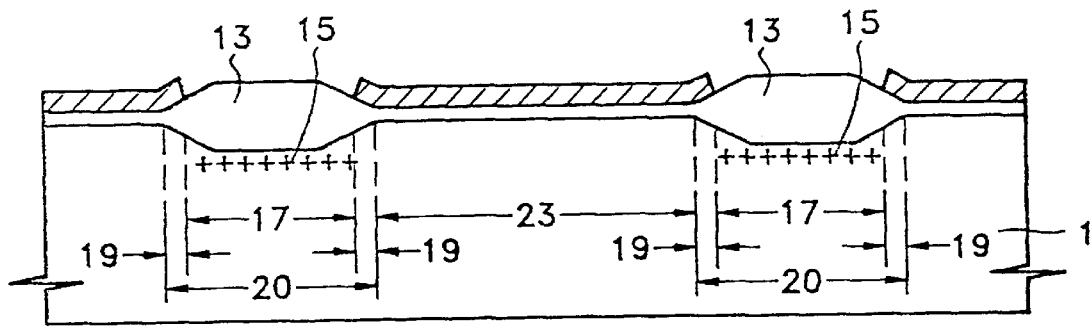
Figure 2A:
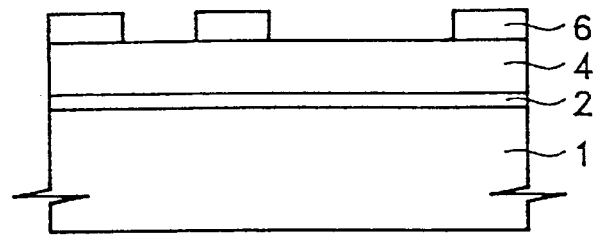
FIGS. 2A–2D are cross-sectional views for illustrating a conventional trench isolation method.
Figure 2B:
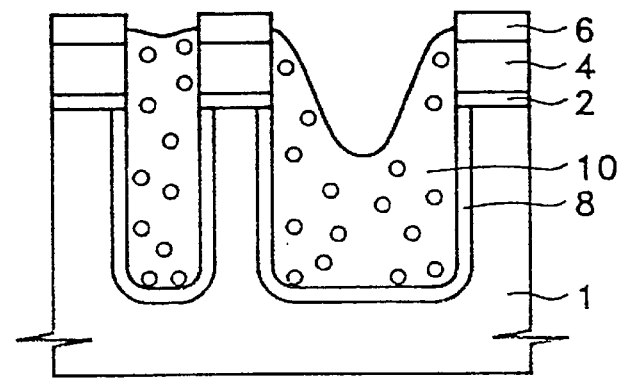
Figure 2C:
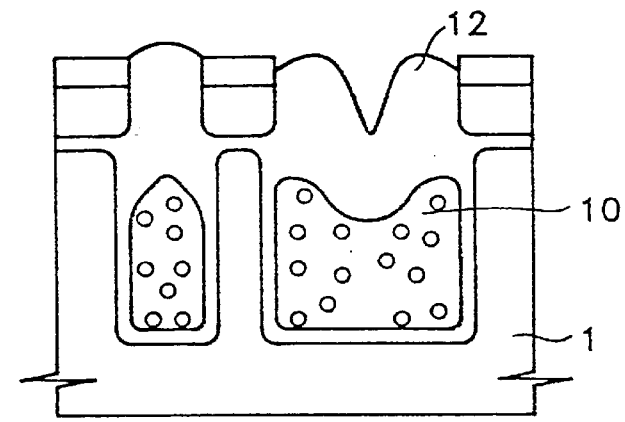
Figure 2D:
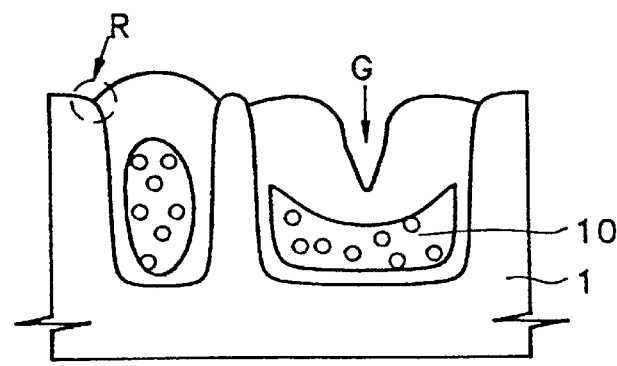
Figure 3:
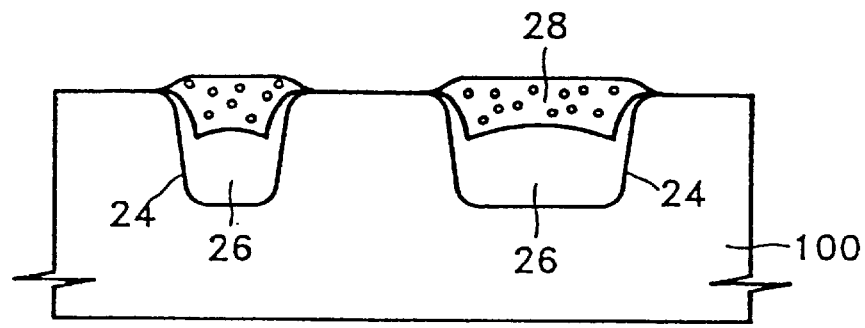
FIG. 3 is a cross-sectional view of a device isolation layer formed according to the present invention.

FIG. 3 is a cross-sectional view of a device isolation layer according to the present invention. In FIG. 3, the reference numeral 100 denotes a semiconductor substrate, 24 denotes a trench, 26 denotes a field oxide layer and 28 denotes an insulating layer.

As shown in FIG. 3, the device isolation layer is made of trench 24 formed in a field region of semiconductor substrate 100. Field oxide layer 26 is formed on a bottom portion of trench 24, and insulating layer 28 is then formed over field oxide layer 26 to completely fill trench 24. Preferably, insulating layer 28 will have a planar surface. Furthermore, field oxide layer 26 is preferably formed with a thickness ratio of 1:2 for an upper portion of the field oxide layer 26 formed above the plane formed by the bottom of the trench, as compared with a lower portion of the field oxide layer 26 formed below the plane of the bottom of the trench.

Accordingly, the above-described device isolation layer is more deeply formed into the semiconductor substrate when compared to the conventional device isolation layer. As such, the device isolation layer according to the present invention provides improved isolation characteristics. Additionally, as will be seen hereafter, the surface of the insulating layer may be planarized to avoid surface step differences.

FIGS. 4A–5D are cross-sectional views illustrating two preferred embodiments of the method used to form a device isolation layer according to the present invention. Specifically, FIGS. 4A–4D are cross-sectional views illustrating an isolation method according to the first embodiment of the present invention as it is applied to a LOCOS method.

Figure 4A:
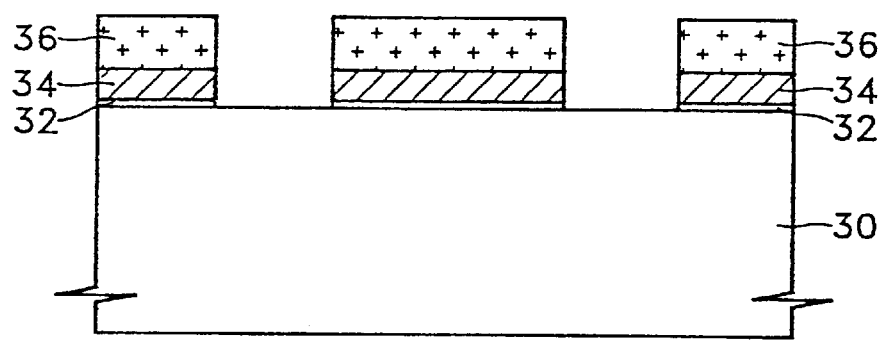
FIGS. 4A–4D are cross-sectional views illustrating the formation of an isolation layer according to a first embodiment of the present invention; and, FIGS. 5A–5E are cross-sectional views illustrating an isolation method according to a second embodiment of the present invention.

Referring to FIG. 4A, the patterns for defining an active region and a field region are formed by the steps of: forming a pad oxide layer 32 and an oxidation blocking layer 34 over a semiconductor substrate 30. A photosensitive layer 36 is then formed over oxidation blocking layer 34 and patterned to remove portions of the photosensitive layer 36 overlaying the field region. Thereafter, oxidation blocking layer 34 and pad oxide layer 32 are etched by photolithography using the patterned photosensitive layer 36 as an etching mask. Thus, selected portions of the semiconductor substrate are exposed in which field regions are to be formed.

A thermal oxide layer of, for example, about 100~1,000 Å thickness is used for pad oxide layer 32. A silicon nitride layer of, for example, about 1,000~2,000 Å thickness is preferably used for oxidation blocking layer 34.

Figure 4B:
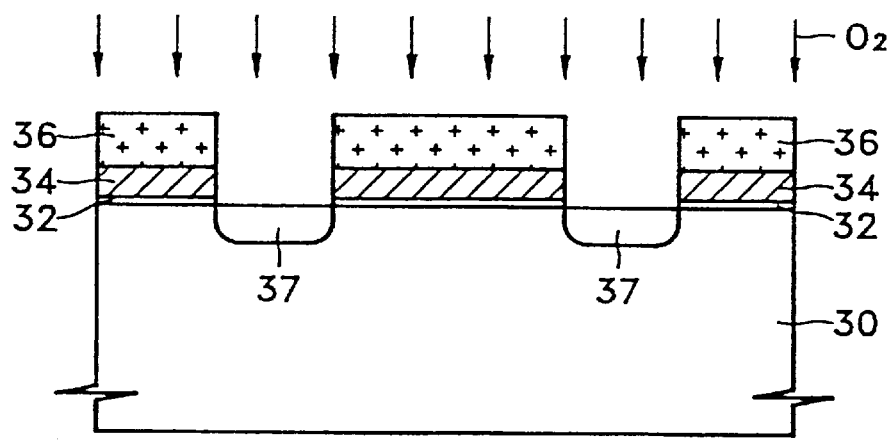

FIG. 4B is a cross-sectional view illustrating the oxygen ion implantation step. Oxygen ions are implanted into the exposed field regions of the semiconductor substrate, thereby forming an oxygen implanted layer 37. It is preferred that the oxygen ions are implanted at the implantation energy of 30~150 KeV and at the dose $1.0 \times 10^{15} \sim 1.0 \times 10^{19}$ dopants/cm$^2$. If necessary, the oxygen implantation process can be carried out using multiple implantation steps of varying implantation energy and dopant concentrations.

Figure 4C:
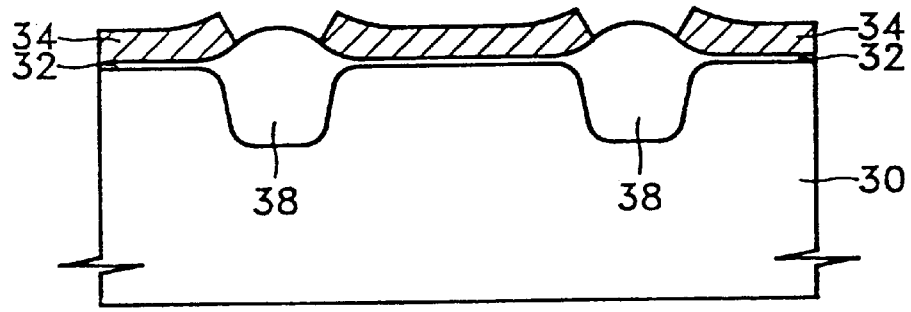

FIG. 4C is a cross-sectional view illustrating the step of forming a field oxide layer 38. More specifically, after removing photosensitive pattern (36 in FIG. 4B), the semiconductor substrate is subjected to thermal oxidation to form field oxide layer 38 of about 500~3,000 Å thickness.

In this step, silicon in the substrate reacts with the implanted oxygen, as well as the oxygen provided to the substrate under conventional oxidation conditions, to form a silicon oxide layer (SiO$_2$). The oxygen ions implanted in semiconductor substrate in the step illustrated in FIG. 4B, accelerate the oxidation process. Accordingly, the time required for oxidation process to obtain an acceptable field oxide layer having the desired depth can be reduced. Reduced "oxidation" time suppresses bird's beak phenomenon.

Field oxide layer 38 is formed with an upper portion above the surface of the semiconductor substrate having a first thickness, and with a lower portion formed in the trench below the surface of the semiconductor substrate having a second thickness. Preferably, the ratio of first thickness to second thickness is 1:2.

Figure 4D:
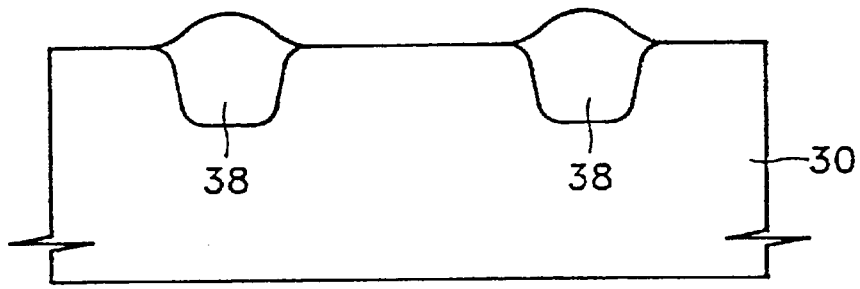

FIG. 4D is a cross-sectional view illustrating the step which completes the device isolation region. Referring to FIG. 4D, pad oxide layer 32 and oxidation blocking layer 34 are removed using conventional techniques.

Thus, according to a first embodiment of the present invention, field oxide layer 38 is deeply formed into the semiconductor substrate to thereby improve the device isolation layer characteristics. The time required to by the oxidation step to obtain an acceptable field oxide layer having a desired depth is reduced, and the bird's beak phenomenon is accordingly reduced.

FIGS. 5A–5E are cross-sectional views illustrating a second embodiment of the present invention as it is applied to a trench-based method.

Figure 5A:
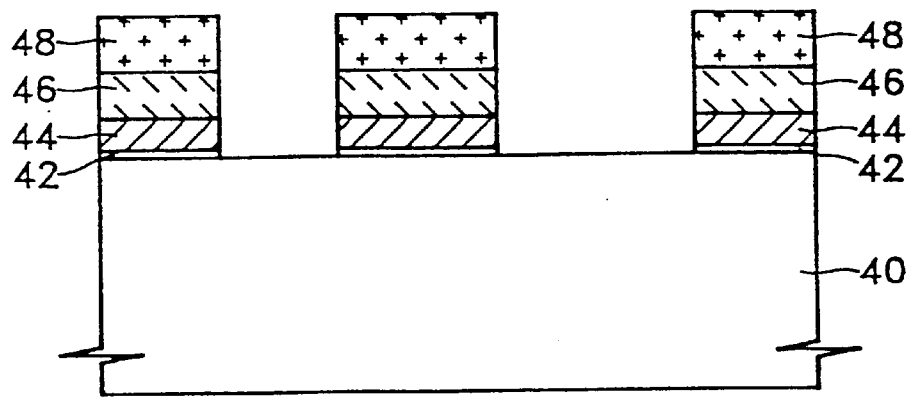

FIG. 5A is a cross-sectional view illustrating the step of forming active patterns which define an active region and a field region. The active patterns are formed by the steps of: forming a pad oxide layer 42 on semiconductor substrate 40; forming an etching blocking layer 44 on pad oxide layer 42; forming an insulating layer 46 on etching blocking layer 44; forming a photosensitive pattern 48 on insulating layer 46; and sequentially etching insulating layer 46, etching blocking layer 44, and pad oxide layer 42 by using photosensitive pattern 48 as an etching mask to thereby form an opening selectively exposing the field region of semiconductor substrate 40.

It is preferred that the thermal oxide layer of, for example, of about 100~1000 Å thickness is used as pad oxide layer 42 and the high temperature oxide (HTO) layer of, for example, 500~2,000 Å thickness is used as insulating layer 46. Etching blocking layer 44, which protects the substrate from the etchant during the photolithography used to form the trench in the semiconductor substrate, is preferably formed of one selected from the group consisting of an oxide layer, a SiN layer, SiON layer, and a double layer made of an oxide layer and a SiN layer, to a thickness of, for example, 1,000~2,000 Å.

Figure 5B:
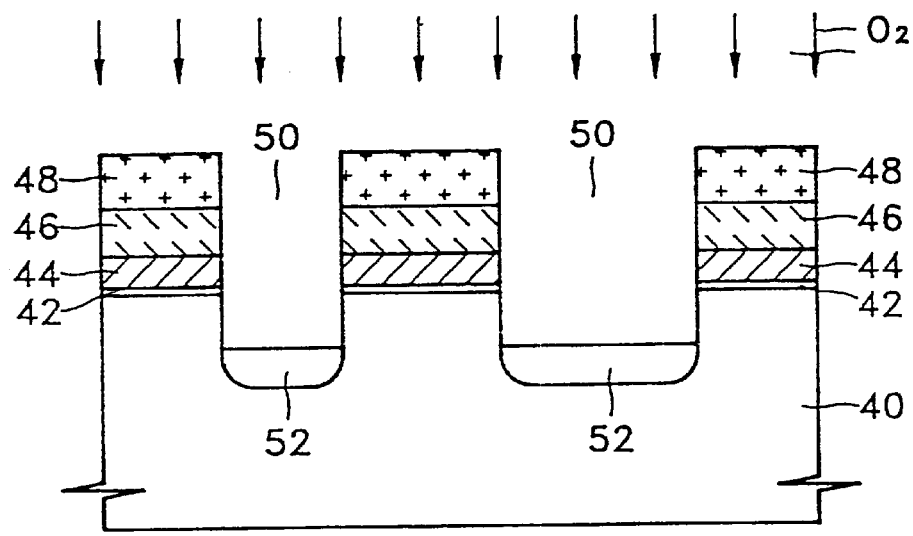

FIG. 5B is a cross-sectional view illustrating the steps of forming a trench and implanting oxygen ions. These steps are sequentially performed by: selectively etching the field region of semiconductor substrate 40 to form a trench 50 and implanting oxygen ions into the bottom of the trench.

It is preferred that the trench is formed to a depth of 500~3,500 Å. It is preferred that the oxygen ions be implanted, for example, at the implantation energy of 30~150 KeV and with a concentration of $1.0 \times 10^{15} \sim 1.0 \times 10^{19}$ dopants/cm$^2$. If necessary, the oxygen ion implantation can be carried out by multiple implantation steps of varying implantation energy and dopant concentration. The reference numeral 52 denotes an implanted oxygen layer.

Figure 5C:
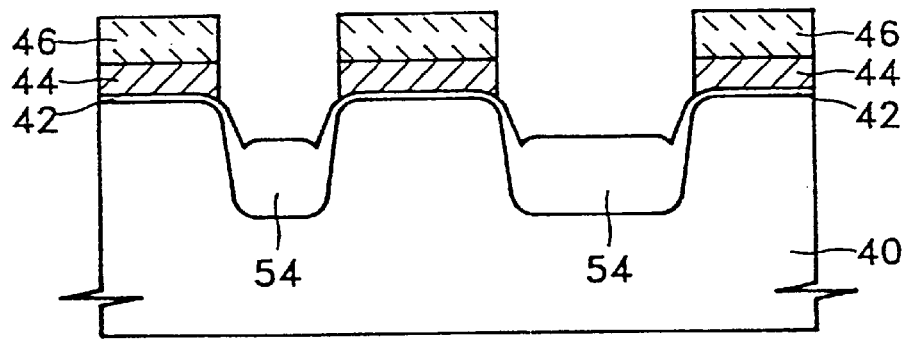

FIG. 5C is a cross-sectional view illustrating the step of forming a field oxide layer 54 at the bottom of trench 50. More specifically, the semiconductor substrate in which oxygen ions have been implanted is subjected to thermal oxidation to thereby form field oxide layer 54 having a thickness of about 100~1,000 Å.

During thermal oxidation, oxygen is provided from the outside the trench to further oxidize the semiconductor substrate. At this time, oxygen ions in implanted oxygen layer 52 (in FIG. 5B) formed in the bottom of trench 50 react with the silicon substrate to form field oxide layer 54. Accordingly, not only is the formation rate of field oxide layer 54 accelerated by the presence of oxygen implanted layer 52, but also field oxide layer 54 is deeply formed into the substrate. Field oxide layer 54 is formed with an upper portion above the bottom surface of the trench (i.e., filling the bottom portion of the trench) having a first thickness, and with a lower portion below the surface of the bottom of the trench having a second thickness. Preferably, the ratio of first thickness to second thickness is 1:2. Since the upper portion of field oxide layer 54 partially fills the trench, thereby decreasing trench depth, the dishing phenomenon which may occur during succeeding planarization processes is markedly reduced.

Figure 5D:
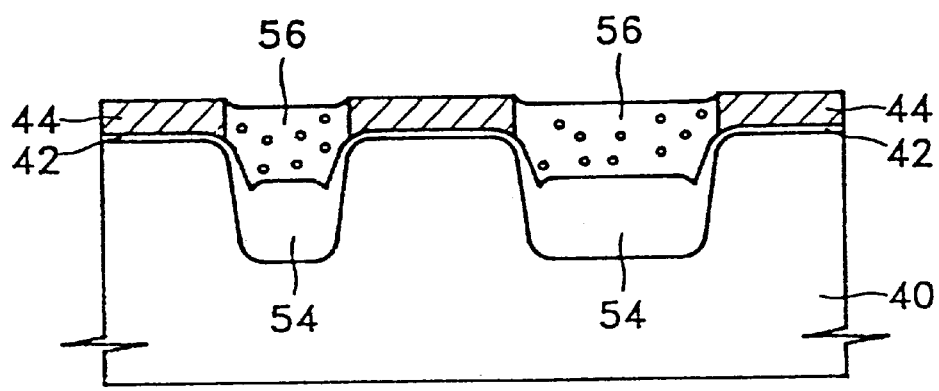

FIG. 5D is a cross-sectional view illustrating the steps of depositing insulation material 56 into trench 50, and planarizing the insulation material. These steps are sequentially performed by: thickly depositing insulation material 56 into trench 50 over field oxide layer 54, so as to fill the trench completely; planarizing the insulation material; and removing insulating layer (46 in FIG. 5C). The planarization of insulation material 56 is performed by, for example, the CMP method using oxidation blocking layer 44 as an etch stopper.

Figure 5E:
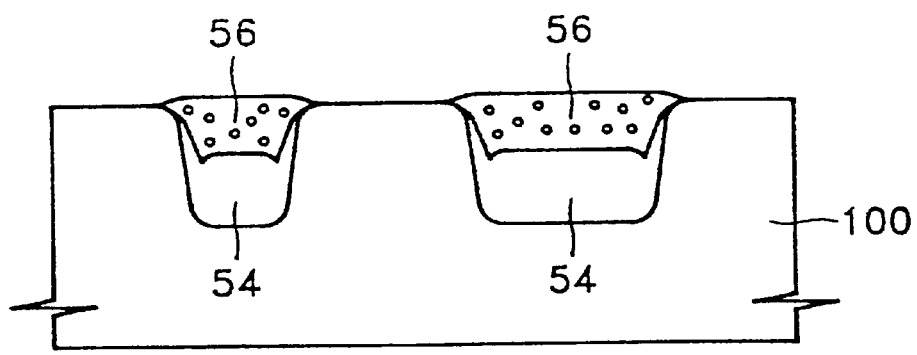

FIG. 5E is a cross-sectional view illustrating the step require to complete the device isolation region according to the present invention. More specifically, oxidation blocking layer (44 in FIG. 5D) and pad oxide layer (42 in FIG. 5D) are sequentially removed to thereby complete the device isolation layer which is made of field oxide layer 54 and insulation material 56 filling trench 50.

According to the second embodiment of the present invention, a thicker device isolation layer, as compared to the conventional trenched-based device isolation region, can be formed in the semiconductor substrate. Device isolation characteristics are necessarily improved. As the trench depth is effectively decreased by the filling effect of the field oxide layer, the dishing phenomenon which occurs during succeeding planarization, especially CMP planarization, is suppressed.

According to the device isolation layer of the present invention and the method for forming same in a semiconductor device, oxygen ions are implanted into a semiconductor substrate, and a field oxide layer is deeply formed into the substrate. Thus, isolation characteristics are improved and the bird's beak and/or the dishing phenomenon are suppressed.

The foregoing embodiments have been given by way of example. The present invention is not limited these examples. Multiple variations and modification to the disclosed embodiments will occur to those skilled in the art upon consideration of foregoing description. Such variations and modifications, however, fall well within the scope of the present invention as set forth in the following claims.

What is claimed is:

1. A semiconductor device comprising:
   a semiconductor substrate including a trench therein;
   a thermal oxide layer in a bottom portion of the trench, said thermal oxide layer comprising:
      an upper portion extending above a bottom surface of the trench to a first thickness to partially fill the trench; and
      a lower portion extending into the semiconductor substrate below the bottom surface of the trench to a second thickness,
   wherein the ratio of first thickness to second thickness is not less than 1 to 2; and
   an insulating layer over the thermal oxide layer, filling the trench, wherein said thermal oxide layer and said insulating layer comprise different materials.

2. The semiconductor device of claim 1, wherein the insulating layer comprises a deposited insulating material.

3. The semiconductor device of claim 1, wherein the thermal oxide layer further comprises regions extending along sidewalls of the trench adjacent said insulating layer.

4. A semiconductor device, comprising:
   a semiconductor substrate having a major surface;
   a thermal oxide region in said substrate, wherein said thermal oxide region comprises:
      a first portion underlying said insulating region; and
      second and third portions protruding from opposite sides of said body portion and extending along opposite boundaries of said insulating region towards said major surface;
      wherein a plane extending through said first portion between points where said second and third portions join said first portion, parallel to said major surface of said semiconductor substrate, defining two regions within said body portion, including:
         an upper region extending above said plane a first thickness; and
         a lower region extending above said plane second thickness, wherein the ratio of the first thickness to the second thickness is not less than 1 to 2; and
   an insulating region on said thermal oxide region extending from said thermal oxide region to said major surface, wherein said insulating region and said thermal oxide region comprise different materials.

5. A semiconductor device, comprising:
   a semiconductor substrate including first and second adjacent trenches therein, said second trench wider than said first trench;
   respective thermal oxide layers in respective bottom portions of said first and second trenches a respective one of said thermal oxide layers comprising:
      an upper portion extending above a bottom surface of the corresponding trench a first thickness to partially fill the trench; and
      a lower portion extending into the semiconductor substrate below the bottom surface of the corresponding trench to a second thickness,
   wherein the ratio of first thickness to second thickness is not less than 1 to 2; and
   respective insulating layers on respective ones of the thermal oxide layers, filling respective ones of the first and second trenches, wherein the insulating layers and the thermal oxide layers comprises different materials.

* * * * *